United States Patent [19]

Namura et al.

[11] Patent Number: 5,898,345
[45] Date of Patent: Apr. 27, 1999

[54] OSCILLATOR CIRCUIT WITH FIRST AND SECOND FREQUENCY CONTROL ELEMENTS

[75] Inventors: Yasuaki Namura, Yokohama; Hideyuki Fukuda, Tokyo, both of Japan

[73] Assignee: Matsushita Electric Industrial Co., Ltd., Osaka, Japan

[21] Appl. No.: 08/892,201

[22] Filed: Jul. 14, 1997

[30] Foreign Application Priority Data

Aug. 12, 1996 [JP] Japan ................................. 8-212311

[51] Int. Cl.$^6$ ........................................ G03B 5/00
[52] U.S. Cl. .................. 331/177 V; 331/158; 331/176; 331/66
[58] Field of Search ............................ 331/176, 177 V, 331/66, 158

[56] References Cited

U.S. PATENT DOCUMENTS 4,996,599 2/1991 Anderson .................... 455/195 X
5,428,319 6/1995 Marvin et al. .................... 331/176

FOREIGN PATENT DOCUMENTS

| 0352695 | 1/1990 | European Pat. Off. . |
| 0615360 | 9/1994 | European Pat. Off. . |
| 3-280605 | 11/1991 | Japan . |
| 6276020 | 9/1994 | Japan . |
| WO96/03799 | 2/1996 | WIPO . |

*Primary Examiner*—Arnold Kinkead
*Attorney, Agent, or Firm*—Pollock, Vande Sande & Amernick

[57] ABSTRACT

A controllable-frequency oscillator has a first portion for generating a signal having a controllable frequency. The controllable-frequency oscillator has a second portion for controlling the frequency of the signal generated by the first portion in response to a first control signal. The controllable-frequency oscillator has a third portion for controlling the frequency of the signal generated by the first portion in response to a second control signal separate from the first control signal.

2 Claims, 5 Drawing Sheets

OSCILLATOR CIRCUIT WITH FIRST AND SECOND FREQUENCY CONTROL ELEMENTS

BACKGROUND OF THE INVENTION

1. Field of the Invention

This invention relates to a controllable-frequency oscillator or an adjustable-frequency oscillator.

2. Description of the Related Art

A typical temperature-compensated crystal oscillator has an oscillating section and a temperature compensating section. The oscillating section includes a quartz-crystal resonator. The oscillating section also includes a circuit connected to the quartz-crystal resonator for generating a signal having a frequency which can be adjusted by a control signal in a range around the resonance frequency of the quartz-crystal resonator. The temperature compensating section includes a temperature sensor. The temperature compensating section also includes a circuit connected to the temperature sensor for generating a temperature-dependent signal. The temperature compensating section feeds the temperature-dependent signal to the oscillating section as a control signal in order to compensate for a temperature-dependent variation in the frequency of the signal generated by the oscillating section.

Japanese published unexamined patent application 6-276020 discloses a controllable-frequency crystal oscillator of the Colpitts type. The crystal oscillator in Japanese application 6-276020 includes only one variable-capacitance diode in a resonator. Furthermore, only one control signal can be applied to the variable-capacitance diode. The frequency of a signal generated by the crystal oscillator can be varied in response to the control signal applied to the variable-capacitance diode. In Japanese application 6-276020, the control signal is generated on the basis of the output signal of a temperature sensor to implement temperature compensation with respect to the frequency of the signal generated by the crystal oscillator.

SUMMARY OF THE INVENTION

It is an object of this invention to provide an improved controllable-frequency oscillator.

A first aspect of this invention provides a controllable-frequency oscillator comprising first means for generating a signal having a controllable frequency; second means for controlling the frequency of the signal generated by the first means in response to a first control signal; and third means for controlling the frequency of the signal generated by the first means in response to a second control signal separate from the first control signal.

A second aspect of this invention is based on the first aspect thereof, and provides a controllable-frequency oscillator wherein the first control signal has a digital form, and the second means comprises a first D/A converter for converting the first control signal into a first control voltage, and means for controlling the frequency of the signal generated by the first means in response to the first control voltage, wherein the second control signal has a digital form, and the third means comprises a second D/A converter for converting the second control signal into a second control voltage, and means for controlling the frequency of the signal generated by the first means in response to the second control voltage, and wherein the first D/A converter has a first resolution and the second D/A converter has a second resolution different from the first resolution.

A third aspect of this invention is based on the first aspect thereof, and provides a controllable-frequency oscillator wherein the second means comprises an inductor, and means for selectively short-circuiting the inductor in response to the first control signal.

A fourth aspect of this invention provides a controller-frequency oscillation circuit comprising a) a controllable-frequency oscillator including first means for generating a signal having a controllable frequency, second means for controlling the frequency of the signal generated by the first means in response to a first control signal, and third means for controlling the frequency of the signal generated by the first means in response to a second control signal separate from the first control signal; and b) a phase locked loop including the controllable-frequency oscillator, wherein a first portion of the phase locked loop feeds the first control signal to the controllable-frequency oscillator, and a second portion of the phase locked loop receives the signal generated by the first means in the controllable-frequency oscillator, and wherein the second control signal travels to the controllable-frequency oscillator along a path outside the phase locked loop.

A fifth aspect of this invention provides a controllable-frequency oscillation circuit comprising a) a controllable-frequency oscillator including first means for generating a signal having a controllable frequency, second means for controlling the frequency of the signal generated by the first means in response to a first control signal, and third means for controlling the frequency of the signal generated by the first means in response to a second control signal separate from the first control signal; b) a temperature sensor for generating a signal depending on an ambient temperature; and c) fourth means for converting the signal generated by the temperature sensor into the first control signal, and for feeding the first control signal to the second means in the controller-frequency oscillator to provide temperature compensation with respect to the frequency of the signal generated by the first means in the controllable-frequency oscillator.

A sixth aspect of this invention provides a controller-frequency oscillator comprising a resonator including a first variable-capacitance diode and a second variable-capacitance diode; first means connected to the resonator for generating a signal having a frequency equal to a resonance frequency of the resonator; second means for applying a first control voltage to the first variable-capacitance diode to control the frequency of the signal generated by the first means in response to the first control voltage; and third means for applying a second control voltage to the second variable-capacitance diode to control the frequency of the signal generated by the first means in response to the second control voltage.

DESCRIPTION OF THE PREFERRED EMBODIMENTS

First Embodiment

Figure 1:
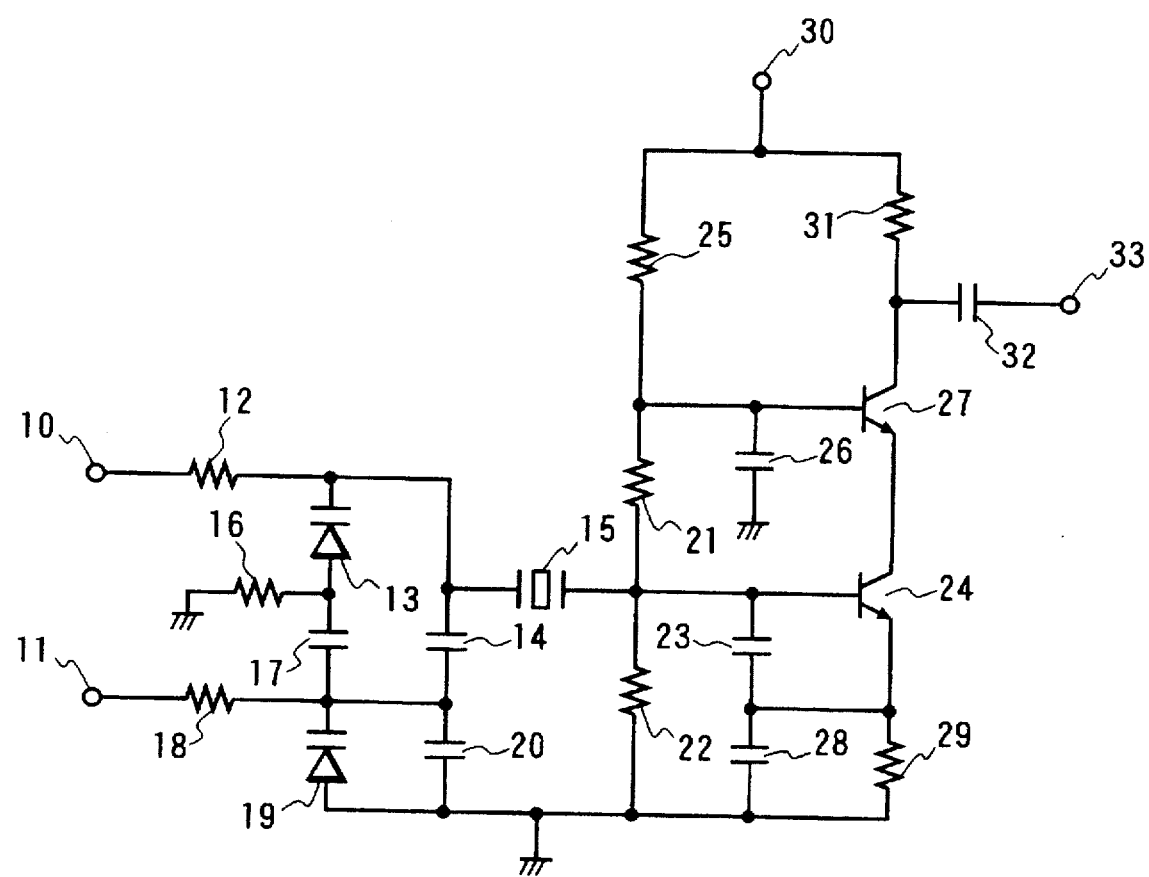
FIG. 1 is a schematic diagram of a controllable-frequency oscillator according to a first embodiment of this invention.

With reference to FIG. 1, a controllable-frequency oscillator includes a first input terminal 10 and a second input terminal 11 for different control signals respectively. The first input terminal 10 leads to a first end of a resistor 12. A second end of the resistor 12 is connected to the cathode of a variable-capacitance diode 13, a first end of a capacitor 14, and a first end of a quartz-crystal resonator 15. The anode of the variable-capacitance diode 13 is connected to a first end of a resistor 16 and a first end of a capacitor 17. A second end of the resistor 16 is grounded.

The second input terminal 11 leads to a first end of a resistor 18. A second end of the resistor 18 is connected to a second end of the capacitor 17, the cathode of a variable-capacitance diode 19, a second end of the capacitor 14, and a first end of a capacitor 20. The anode of the variable-capacitance diode 19 is grounded. A second end of the capacitor 20 is grounded.

A second end of the quartz-crystal resonator 15 is connected to a first end of a resistor 21, a first end of a resistor 22, a first end of a capacitor 23, and the base of an NPN transistor 24. A second end of the resistor 21 is connected to a first end of a resistor 25, a first end of a capacitor 26, and the base of an NPN transistor 27. A second end of the resistor 22 is grounded. A second end of the capacitor 23 is connected to a first end of a capacitor 28 and a first end of a resistor 29. A second end of the capacitor 28 is grounded. A second end of the resistor 29 is grounded. The emitter of the transistor 24 is connected to the first end of the resistor 29 and the first end of the capacitor 28. A second end of the resistor 25 is connected to a power supply terminal 30. A second end of the capacitor 26 is grounded. The emitter of the transistor 27 is connected to the collector of the transistor 24. The collector of the transistor 27 is connected to a first end of a resistor 31 and a first end of a capacitor 32. A second end of the resistor 31 is connected to the power supply terminal 30. A second end of the capacitor 32 is connected to an output terminal 33. The power supply terminal 30 is connected to the positive terminal of a dc power supply (not shown). The negative terminal of the dc power supply is grounded.

The oscillator of FIG. 1 generates a signal having a frequency which can be adjusted in a range around the resonance frequency of the quartz-crystal resonator 15. The signal generated by the oscillator of FIG. 1 will also be referred to as the oscillation signal. The frequency of the signal generated by the oscillator of FIG. 1 will also be referred to as the oscillation signal frequency. The oscillation signal can be transmitted via the output terminal 33 to an external device (not shown). The oscillator of FIG. 1 has an oscillating section and a frequency control section. The oscillating section is of the Colpitts type.

The quartz-crystal resonator 15, the variable-capacitance diodes 13 and 19, and other parts compose an effective resonator or an actual resonator whose resonance frequency determines the oscillation signal frequency (the frequency of the signal generated by the oscillator of FIG. 1). The resonance frequency of the effective resonator, that is, the oscillation signal frequency, depends on the capacitances of the diodes 13 and 19. The capacitance of each of the diodes 13 and 19 depends on a voltage applied thereacross.

A first control voltage is applied between the first input terminal 10 and the ground. The first control voltage is transmitted to the variable-capacitance diode 13 via the resistors 12 and 16. Thus, a voltage depending on the first control voltage is applied across the variable-capacitance diode 13. Accordingly, the capacitance of the diode 13 varies in accordance with the first control voltage. This means that the oscillation signal frequency can be controlled or adjusted in response to the first control voltage.

A second control voltage is applied between the second input terminal 11 and the ground. The second control voltage is transmitted to the variable-capacitance diode 19 via the resistor 18. Thus, a voltage depending on the second control voltage is applied across the variable-capacitance diode 19. Accordingly, the capacitance of the diode 19 varies in accordance with the second control voltage. This means that the oscillation signal frequency can be controlled or adjusted in response to the second control voltage.

Preferably, the characteristics of the variable-capacitance diodes 13 and 19 are chosen so that the relation between the first control voltage and the oscillation signal frequency differs from the relation between the second control voltage and the oscillation signal frequency. For example, the rate of a variation in the oscillation signal frequency in response to a change in the first signal voltage differs from the rate of a variation in the oscillation signal frequency in response to a change in the second signal voltage. In this case, the oscillation signal frequency is more sensitive to one of the first and second control voltages than the other.

The oscillator of FIG. 1 may be modified so that the oscillation signal frequency can respond to three or more different control voltages. The variable-capacitance diodes 13 and 19 may be connected in parallel. The quartz-crystal resonator 15 may be replaced by a resonator of another type.

Second Embodiment

Figure 2:
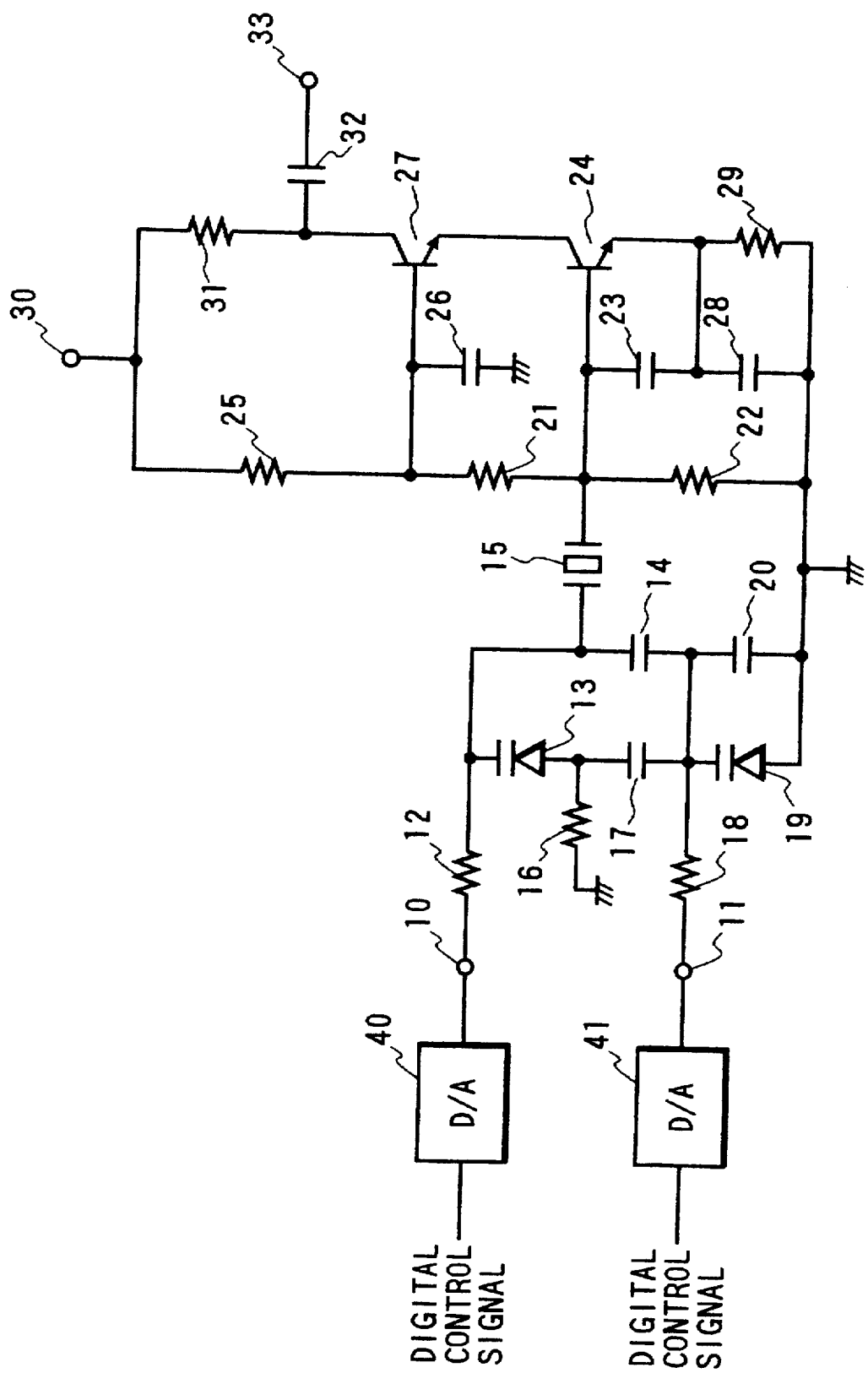
FIG. 2 is a diagram of a controllable-frequency oscillator according to a second embodiment of this invention.

FIG. 2 shows a second embodiment of this invention which is similar to the embodiment of FIG. 1 except for an additional arrangement explained hereinafter. In the embodiment of FIG. 2, the oscillation signal frequency is more sensitive to the first control voltage than the second control voltage. The embodiment of FIG. 2 includes a low-resolution D/A converter 40 connected to the first oscillator input terminal 10. The embodiment of FIG. 2 includes a high-resolution D/A converter 41 connected to the second oscillator input terminal 11.

The D/A converter 40 receives a first digital control signal, and converts the first digital control signal into the first control voltage. The D/A converter 40 outputs the first control voltage to the first oscillator input terminal 10. The D/A converter 41 receives a second digital control signal, and converts the second digital control signal into the second control voltage. The D/A converter 41 outputs the second control voltage to the second oscillator input terminal 11. Preferably, the first digital control signal is used in determining or selecting the frequency band in which the oscillation signal frequency is variable. On the other hand, the second digital control signal is used in finely controlling or varying the oscillation signal frequency within the determined frequency band.

Third Embodiment

Figure 3:
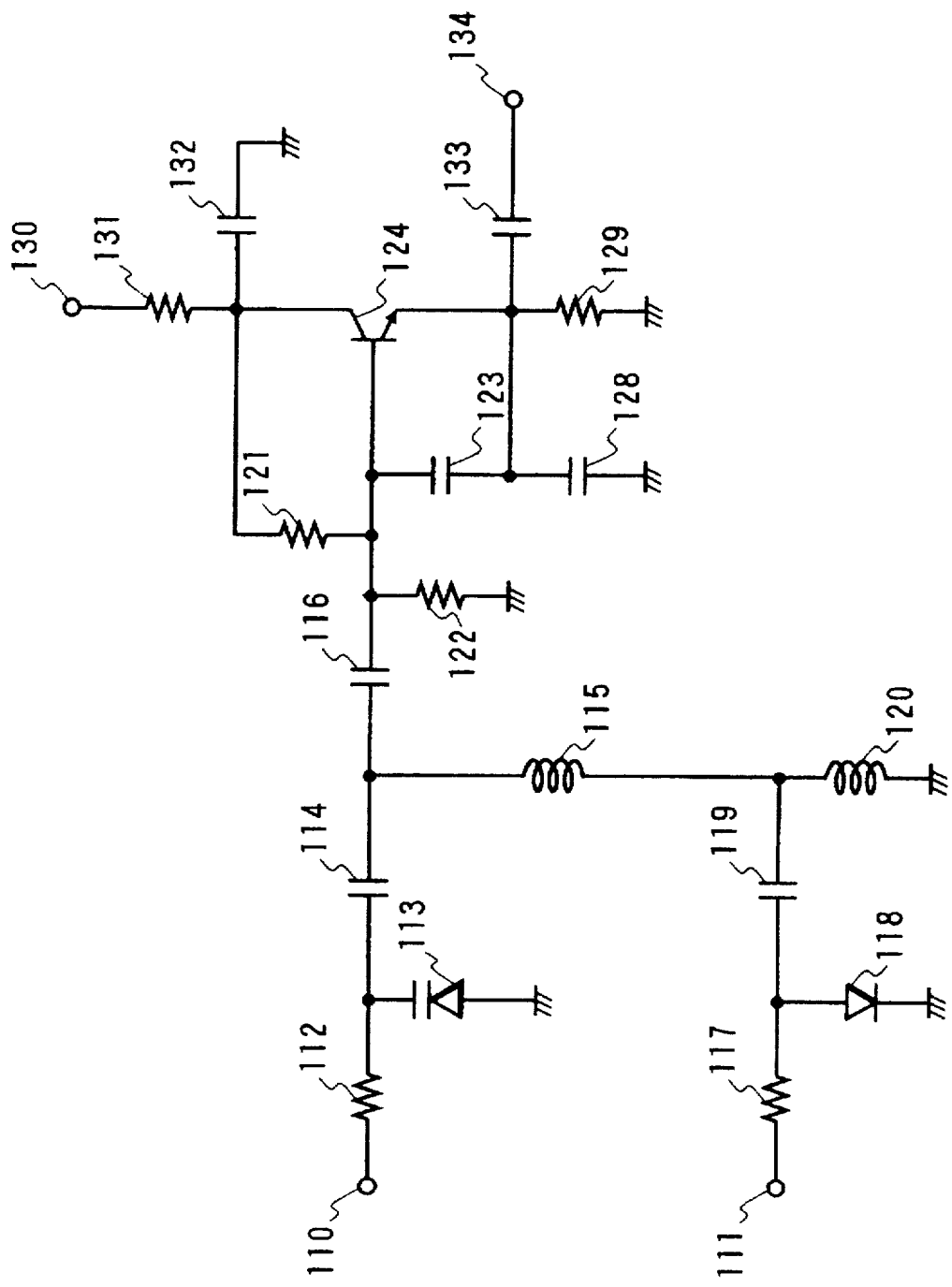
FIG. 3 is a schematic diagram of a controllable-frequency oscillator according to a third embodiment of this invention.

With reference to FIG. 3, a controllable-frequency oscillator includes a first input terminal 110 and a second input terminal 111 for different control signals respectively. The first input terminal 110 leads to a first end of a resistor 112. A second end of the resistor 112 is connected to the cathode of a variable-capacitance diode 113 and a first end of a capacitor 114. The anode of the variable-capacitance diode 113 is grounded. A second end of the capacitor 114 is connected to a first end of an inductor 115 and a first end of a capacitor 116.

The second input terminal 111 leads to a first end of a resistor 117. A second end of the resistor 117 is connected to the anode of a diode 118 and a first end of a capacitor 119. The cathode of the diode 118 is grounded. A second end of the capacitor 119 is connected to a second end of the inductor 115 and a first end of an inductor 120. A second end of the inductor 120 is grounded.

A second end of the capacitor 116 is connected to a first end of a resistor 121, a first end of a resistor 122, a first end of a capacitor 123, and the base of an NPN transistor 124. A second end of the resistor 121 is connected to the collector of the transistor 124. A second end of the resistor 122 is grounded. A second end of the capacitor 123 is connected to a first end of a capacitor 128 and a first end of a resistor 129. A second end of the capacitor 128 is grounded. A second end of the resistor 129 is grounded. The emitter of the transistor 124 is connected to the first end of the resistor 129 and the first end of the capacitor 128. The emitter of the transistor 124 is also connected to a first end of a capacitor 133. A second end of the capacitor 133 leads to an output terminal 134. A power supply terminal 130 is connected to a first end of a resistor 131. The collector of the transistor 124 is connected to a second end of the resistor 131 and a first end of a capacitor 132. A second end of the capacitor 132 is grounded. The power supply terminal 130 is connected to the positive terminal of a dc power supply (not shown). The negative terminal of the dc power supply is grounded.

The oscillator of FIG. 3 generates a signal having a controllable frequency or a variable frequency. The signal generated by the oscillator of FIG. 3 will also be referred to as the oscillation signal. The frequency of the signal generated by the oscillator of FIG. 3 will also be referred to as the oscillation signal frequency. The oscillation signal can be transmitted via the output terminal 134 to an external device (not shown). The oscillator of FIG. 3 has an oscillating section and a frequency control section. The oscillating section is of the Colpitts type.

The variable-capacitance diode 113, the inductors 115 and 120, and other parts compose a resonator whose resonance frequency determines the oscillation signal frequency (the frequency of the signal generated by the oscillator of FIG. 3). The resonance frequency of the resonator, that is, the oscillation signal frequency, depends on the capacitance of the diode 113. The capacitance of the diode 113 depends on a voltage applied thereacross.

The diode 118 serves to selectively short-circuit the inductor 120 with respect to an RF (radio frequency) signal. The resonance frequency of the resonator, that is, the oscillation signal frequency, depends on whether or not the inductor 120 is short-circuited.

A first control voltage is applied between the first input terminal 110 and the ground. The first control voltage is transmitted to the variable-capacitance diode 113 via the resistor 112. Thus, a voltage depending on the first control voltage is applied across the variable-capacitance diode 113. Accordingly, the capacitance of the diode 113 varies in accordance with the first control voltage. This means that the oscillation signal frequency can be controlled or adjusted in response to the first control voltage.

A second control voltage is applied between the second input terminal 111 and the ground. The second control voltage is transmitted to the diode 118 via the resistor 117 as a biasing voltage. The second control voltage can be changed between an ON biasing level and an OFF biasing level. When the second control voltage assumes the ON biasing level, the diode 118 falls into an ON state so that the inductor 120 is short-circuited. When the second control voltage assumes the OFF biasing level, the diode 118 falls into an OFF state so that the inductor 120 moves out of the short-circuited state. Accordingly, the inductor 120 is selectively short-circuited in accordance with the second control voltage. This means that the oscillation signal frequency can be changed in response to the second control voltage.

Preferably, the second control voltage is used in changing or selecting the frequency band in which the oscillation signal frequency is variable. On the other hand, the first control voltage is used in finely controlling or varying the oscillation signal frequency within the selected frequency band.

Fourth Embodiment

Figure 4:
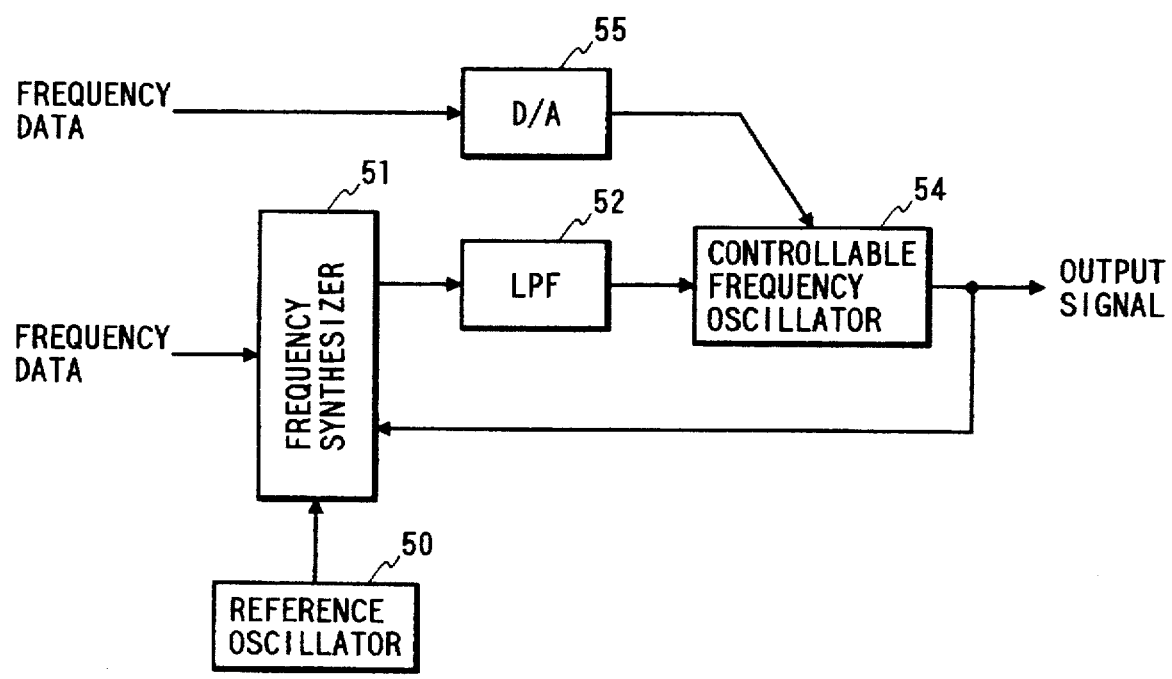
FIG. 4 is a block diagram of a controllable-frequency oscillation circuit according to a fourth embodiment of this invention.

With reference to FIG. 4, a fixed-frequency oscillator 50 is connected to a frequency synthesizer 51. The frequency synthesizer 51 is connected to a low pass filter 52. The low pass filter 52 is connected to a controllable-frequency oscillator 54. A D/A converter 55 is connected to the controllable-frequency oscillator 54. The controllable-frequency oscillator 54 is connected to the frequency synthesizer 51.

The oscillator 50 outputs a reference signal to the frequency synthesizer 51. The reference signal has a predetermined fixed frequency. The frequency synthesizer 51 receives an output signal from the controllable-frequency oscillator 54. The frequency synthesizer 51 receives a first digital control signal (first frequency data). The frequency synthesizer 51 includes a variable frequency divider which divides the frequency of the output signal of the controllable-frequency oscillator 54 by a factor depending on the first frequency data. The frequency synthesizer 51 includes a phase comparator which compares the phase of the output signal of the frequency divider and the phase of the reference signal. The output signal of the phase comparator in the frequency synthesizer 51 is fed to the low pass filter 52. The low pass filter 52 makes the output signal of the phase comparator into a first control voltage. The low pass filter 52 outputs the first control voltage to the controllable-frequency oscillator 54.

The controllable-frequency oscillator of FIG. 1 is used as the controllable-frequency oscillator 54. The first control voltage is applied from the low pass filter 52 to the first input terminal 10 (see FIG. 1) of the controllable-frequency oscillator 54. Alternatively, the first control voltage may be applied from the low pass filter 52 to the second input terminal 11 (see FIG. 1) of the controller-frequency oscillator 54. The controllable-frequency oscillator 54 generates a signal having a frequency which depends on the first control voltage. The controllable-frequency oscillator 54 outputs the generated signal to the frequency synthesizer 51.

The frequency synthesizer 51, the low pass filter 52, and the controllable-frequency oscillator 54 compose a PLL (phase locked loop) circuit. The controllable-frequency oscillator 54 outputs the oscillation signal to an external device (not shown).

The D/A converter 55 receives a second digital control signal (second frequency data), and converts the second digital control signal into a second control voltage. The D/A converter 55 outputs the second control voltage to the controllable-frequency oscillator 54. Specifically, the D/A converter 55 applies the second control voltage to the second input terminal 11 (see FIG. 1) of the controllable-frequency oscillator 54. Alternatively, the D/A converter 55 may apply the second control voltage to the first input terminal 10 (see FIG. 1) of the controllable-frequency oscillator 54. Accordingly, the frequency of the signal generated by the controllable-frequency oscillator 54, that is, the oscillation signal frequency, depends on the second control voltage.

The first frequency data fed to the frequency synthesizer 51 and the second frequency data fed to the D/A converter 55 represent a desired frequency. The oscillation signal frequency is controlled at the desired frequency. Preferably, the second frequency data fed to the D/A converter 55 is used in changing the width of the band in which the oscillation signal frequency is variable according to the first frequency data fed to the frequency synthesizer 51.

It should be noted that the controllable-frequency oscillator of FIG. 3 may be used as the controllable-frequency oscillator 54.

Fifth Embodiment

Figure 5:
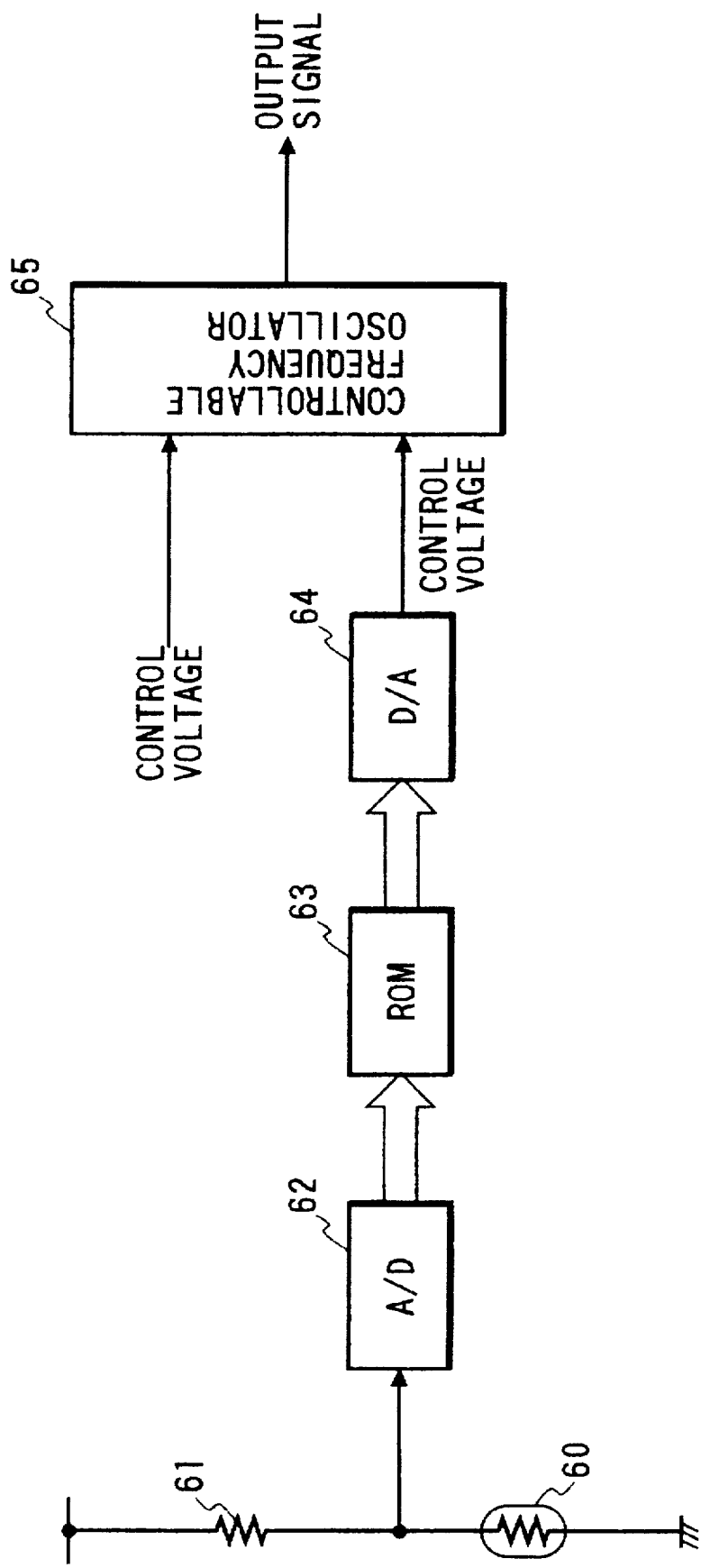
FIG. 5 is a block diagram of a controllable-frequency oscillation circuit according to a fifth embodiment of this invention.

With reference to FIG. 5, a thermistor 60 is connected in series with a resistor 61. The series combination of the thermistor 60 and the resistor 61 is connected across a dc voltage source (not shown). The thermistor 60 serves as a temperature sensor. A voltage across the thermistor 60 depends on the ambient temperature. The voltage across the thermistor 60 is also referred to as the temperature-representing voltage.

An A/D converter 62 is connected to the thermistor 60. The A/D converter 62 receives the temperature-representing voltage, and converts the temperature-representing voltage into a temperature-representing digital signal.

A ROM (read only memory) 63 is connected to the A/D converter 62. The ROM 63 stores predetermined data indicating a table which provides a desired relation between the temperature and a first control voltage. The desired relation is designed to implement temperature compensation with respect to an oscillation signal frequency. The ROM 63 receives the temperature-representing digital signal from the A/D converter 62 as an address signal for accessing a segment of the data in the table. The ROM 63 outputs a digital signal representative of a desired value of the first control voltage in response to the address signal.

A D/A converter 64 is connected between the ROM 63 and a controllable-frequency oscillator 65. The D/A converter 64 receives the digital signal from the ROM 63, and converts the digital signal into the first control voltage. The D/A converter 64 outputs the first control signal to the controllable-frequency oscillator 65.

The controllable-frequency oscillator of FIG. 1 is used as the controllable-frequency oscillator 65. The first control voltage is applied from the D/A converter 64 to the first input terminal 10 (see FIG. 1) of the controllable-frequency oscillator 65. Alternatively, the first control voltage may be applied from the D/A converter 64 to the second input terminal 11 (see FIG. 1) of the controller-frequency oscillator 65. The controllable-frequency oscillator 65 generates a signal having a frequency which depends on the first control voltage. The signal generated by the controllable-frequency oscillator 65 will also be referred to as the oscillation signal. The frequency of the signal generated by the controllable-frequency oscillator 65 will also be referred to as the oscillation signal frequency. The dependence of the oscillation signal frequency upon the first control voltage is designed to provide temperature compensation with respect to the oscillation signal frequency. Therefore, the oscillation signal frequency is independent of the ambient temperature. The controllable-frequency oscillator 65 outputs the oscillation signal to an external device (not shown).

The controllable-frequency oscillator 65 receives a second control voltage. Specifically, the second input terminal 11 (see FIG. 1) of the controllable-frequency oscillator 65 receives the second control voltage. Alternatively, the first input terminal 10 (see FIG. 1) of the controllable-frequency oscillator 65 may receive the second control voltage. Accordingly, the frequency of the signal generated by the controllable-frequency oscillator 65, that is, the oscillation signal frequency, depends on the second control voltage. Preferably, the second control voltage is used in positively controlling or adjusting the oscillation signal frequency.

It should be noted that the controllable-frequency oscillator of FIG. 3 may be used as the controllable-frequency oscillator 65.

What is claimed is:

1. A controllable-frequency oscillator comprising:

a first input terminal for receiving a first control signal;

a second input terminal for receiving a second control signal;

a quartz-crystal resonator having a first end and a second end;

a first resistor;

a first variable-capacitance diode having an anode and a cathode, the cathode of the first variable-capacitance diode being connected to the first input terminal and the first end of the quartz-crystal resonator, the anode of the first variable-capacitance diode being grounded via the first resistor;

a first capacitor;

a second capacitor;

a second variable-capacitance diode having an anode and a cathode, the cathode of the second variable-capacitance diode being connected to the second input terminal, the cathode of the second variable-capacitance diode being connected via the first capacitor to a junction between the first resistor and the anode of the first variable-capacitance diode, the cathode of the second variable-capacitance diode being connected to the first end of the quartz-crystal resonator via the second capacitor, the anode of the second variable-capacitance diode being grounded;

a third capacitor being connected in parallel with the second variable-capacitance diode;

a second resistor;

a fourth capacitor;

a fifth capacitor;

a first transistor having a base, a collector, and an emitter, the base of the first transistor being connected to the second end of the quartz-crystal resonator, the emitter of the first transistor being grounded via the second resistor, the emitter of the first transistor being grounded via the fourth capacitor, the base of the first transistor being connected via the fifth capacitor to a junction between the second resistor and the emitter of the first transistor;

an output terminal;

a sixth capacitor; and a second transistor having a collector and an emitter, the emitter of the second transistor being connected to the collector of the first transistor, the collector of the second transistor being connected via the sixth capacitor to the output terminal;

wherein an output signal appearing at the output terminal has a frequency which depends on the first control signal and the second control signal.

2. A controllable-frequency oscillator according to claim 1, further comprising a seventh capacitor, the base of the second transistor being grounded via the seventh capacitor.

* * * * *